United States Patent
Yoshioka et al.

(10) Patent No.: US 12,170,316 B2
(45) Date of Patent: Dec. 17, 2024

(54) NITRIDE SEMICONDUCTOR DEVICE WITH ELEMENT ISOLATION AREA

(71) Applicants: Kabushiki Kaisha Toshiba, Tokyo (JP); Toshiba Electronic Devices & Storage Corporation, Tokyo (JP)

(72) Inventors: Akira Yoshioka, Yokohama Kanagawa (JP); Yasuhiro Isobe, Ota Tokyo (JP); Hung Hung, Kawasaki Kanagawa (JP); Hitoshi Kobayashi, Yamato Kanagawa (JP); Tetsuya Ohno, Yokohama Kanagawa (JP); Toru Sugiyama, Musashino Tokyo (JP)

(73) Assignees: Kabushika Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/490,965

(22) Filed: Oct. 20, 2023

(65) Prior Publication Data
US 2024/0047533 A1 Feb. 8, 2024

Related U.S. Application Data

(63) Continuation of application No. 17/190,070, filed on Mar. 2, 2021, now Pat. No. 11,830,916.

(30) Foreign Application Priority Data

Sep. 15, 2020 (JP) .................................. 2020-155011

(51) Int. Cl.
*H01L 29/778* (2006.01)
*H01L 29/06* (2006.01)
(Continued)

(52) U.S. Cl.
CPC ...... *H01L 29/2003* (2013.01); *H01L 29/0653* (2013.01); *H01L 29/41775* (2013.01); *H01L 29/7786* (2013.01)

(58) Field of Classification Search
CPC . H01L 29/0642–0653; H01L 29/66431; H01L 29/66462; H01L 29/778–7789
See application file for complete search history.

(56) References Cited

U.S. PATENT DOCUMENTS

| 8,507,919 B2 | 8/2013 | Ishikura |
| 8,791,505 B2 | 7/2014 | Kinoshita |

(Continued)

FOREIGN PATENT DOCUMENTS

| CN | 101320751 A | 12/2008 |
| CN | 102201442 A | 9/2011 |

(Continued)

OTHER PUBLICATIONS

Japanese Office Action dated Jul. 25, 2023, mailed in counterpart Japanese Application No. 2020-155011, 9 pages (with translation).

(Continued)

*Primary Examiner* — Eric A. Ward
(74) *Attorney, Agent, or Firm* — Kim & Stewart LLP

(57) ABSTRACT

A semiconductor device includes first and second nitride semiconductor layers. The second layer on the first nitride has a first region, a second region, and a third region between the first and second regions. A first gate electrode is in the first region and extends parallel to a surface of a substrate. A first source electrode is in the first region and extends in the first direction. A second gate electrode in the second region and extends in the first direction. A second source electrode is in the second region and extends in the first direction. A drain electrode coupled to a first and a second wiring. The first wiring directly contacts the second (Continued)

nitride semiconductor layer in the first region. The second wiring directly contacts the second nitride semiconductor layer in the second region. An insulation material is in the third region.

20 Claims, 9 Drawing Sheets

(51) Int. Cl.
H01L 29/20 (2006.01)
H01L 29/417 (2006.01)

(56) References Cited

U.S. PATENT DOCUMENTS

| | | | |
|---|---|---|---|
| 9,716,185 B2 | 7/2017 | Nogami | |
| 9,911,842 B2 | 3/2018 | Umeno | |
| 2009/0065810 A1 | 3/2009 | Honea | |
| 2011/0147796 A1 | 6/2011 | Haeberlen | |
| 2012/0138948 A1 | 6/2012 | Miyajima et al. | |
| 2014/0077217 A1* | 3/2014 | Saito | H01L 24/14 |
| | | | 257/76 |
| 2014/0264453 A1* | 9/2014 | Moens | H01L 29/205 |
| | | | 257/194 |
| 2015/0340485 A1 | 11/2015 | Cheng | |
| 2016/0087052 A1 | 3/2016 | Kajiwara | |
| 2016/0087074 A1* | 3/2016 | Prechtl | H01L 23/53238 |
| | | | 438/652 |
| 2017/0125533 A1* | 5/2017 | Kotani | H01L 29/408 |
| 2017/0263528 A1* | 9/2017 | Yoshida | H01L 29/7786 |
| 2020/0111779 A1 | 4/2020 | Machida | |
| 2020/0295173 A1* | 9/2020 | Escoffier | H01L 29/2003 |
| 2022/0085175 A1 | 3/2022 | Yoshioka | |

FOREIGN PATENT DOCUMENTS

| | | |
|---|---|---|
| CN | 102487081 A | 6/2012 |
| JP | 2005303137 A | 10/2005 |
| JP | 2012028441 A | 2/2012 |
| JP | 2012099542 A | 5/2012 |
| JP | 5596495 B2 | 9/2014 |
| JP | 2016063167 A | 4/2016 |
| WO | 2017098603 A1 | 6/2017 |
| WO | 2019053905 A1 | 12/2019 |

OTHER PUBLICATIONS

Chinese Office Action dated Oct. 8, 2024 mailed in counterpart Chinese Application No. 202110023207.0, 22 pages.

* cited by examiner

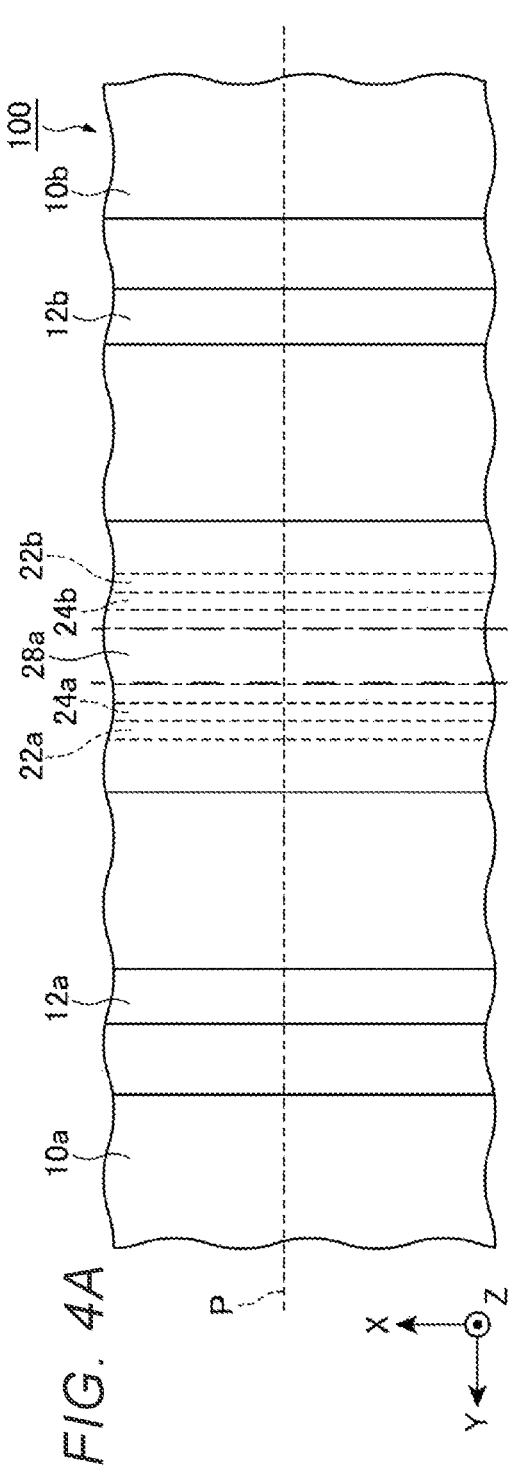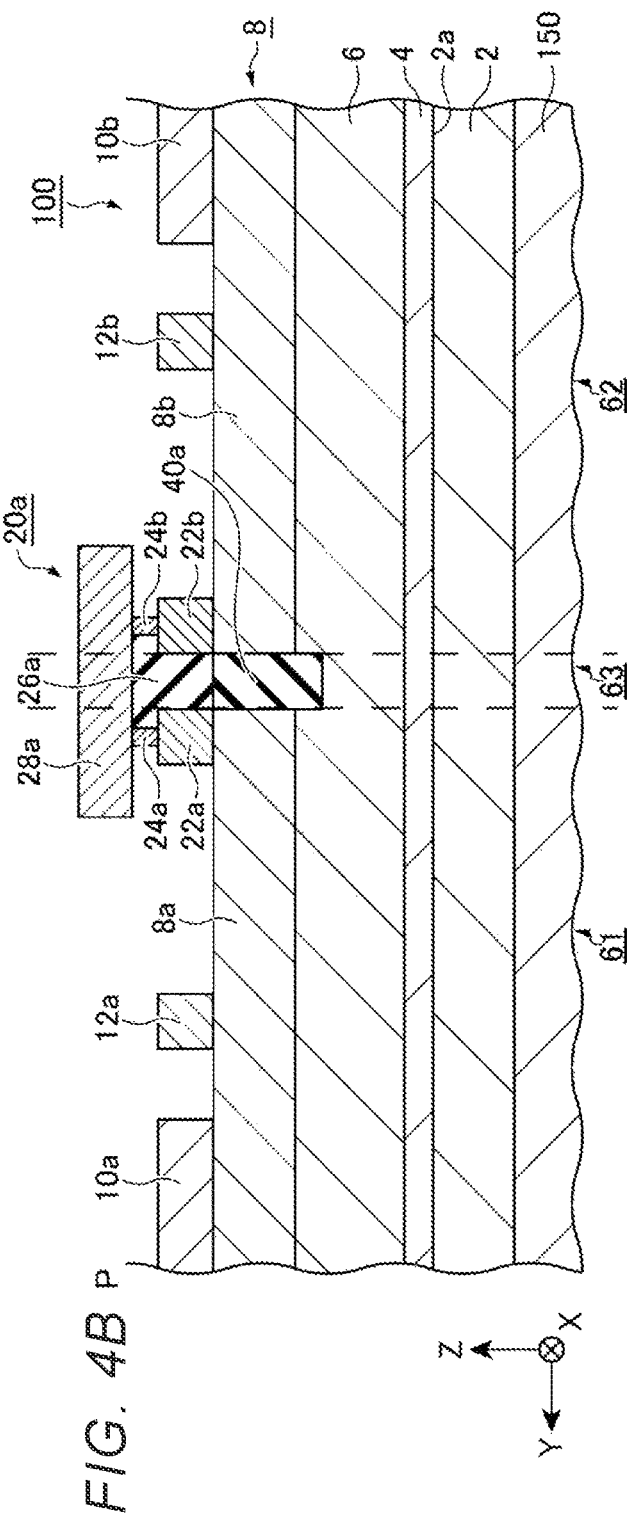

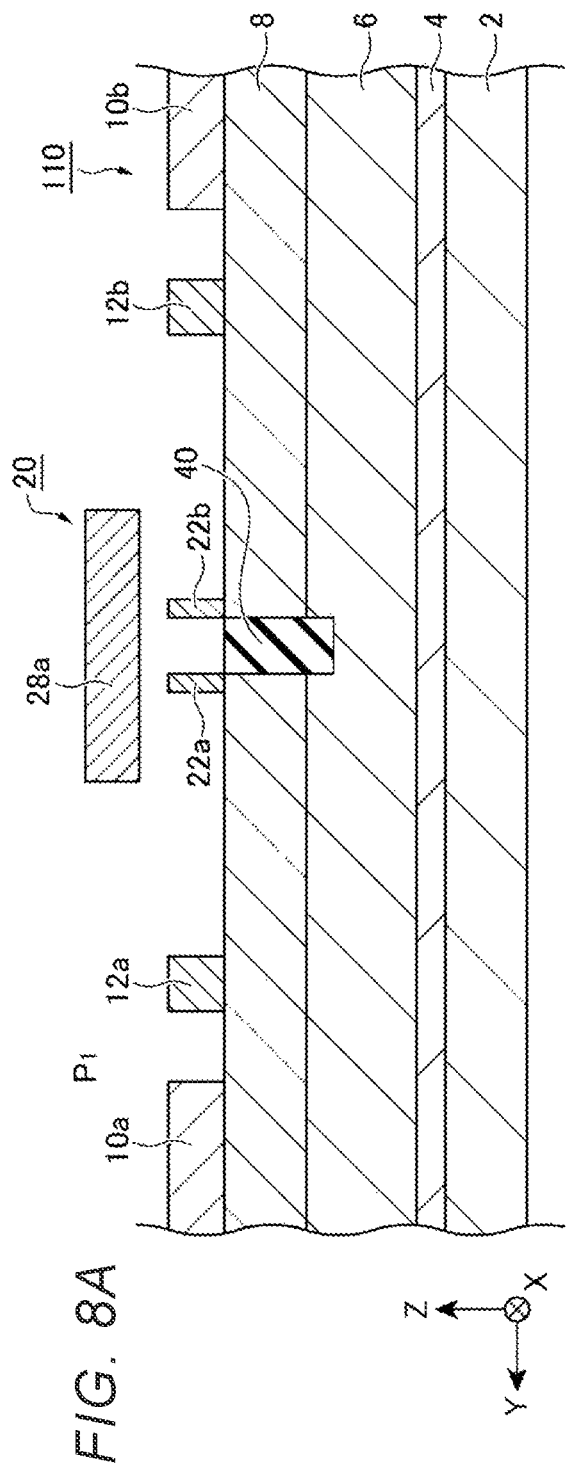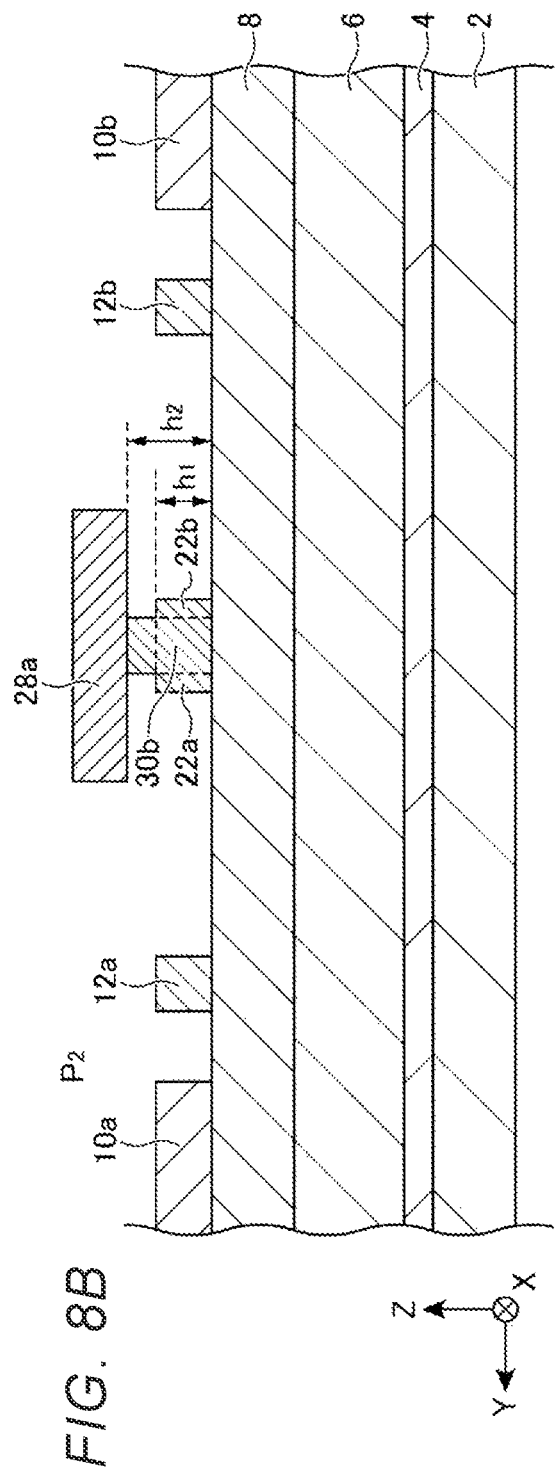

NITRIDE SEMICONDUCTOR DEVICE WITH ELEMENT ISOLATION AREA

CROSS-REFERENCE TO RELATED APPLICATION(S)

This application is a continuation of U.S. patent application Ser. No. 17/190,070, filed Mar. 2, 2021, which is based upon and claims the benefit of priority from Japanese Patent Application No. 2020-155011, filed Sep. 15, 2020, the entire contents of each of which are incorporated herein by reference.

FIELD

Embodiments described herein relate generally to a semiconductor device.

BACKGROUND

Group III nitride semiconductors, for example, gallium nitride (GaN) semiconductors, are promising as materials for next-generation power semiconductor devices. A GaN semiconductor has a large bandgap as compared with a silicon semiconductor. For this reason, a GaN semiconductor device can be used to provide a smaller sized high-breakdown-voltage power semiconductor device as compared with a silicon semiconductor device.

BRIEF DESCRIPTION OF THE DRAWINGS

FIGS. 4A and 4B are schematic views of a semiconductor device of a first embodiment.

FIGS. 8A and 8B are schematic cross-sectional views of a semiconductor device of a second embodiment.

DETAILED DESCRIPTION

Figure 1:
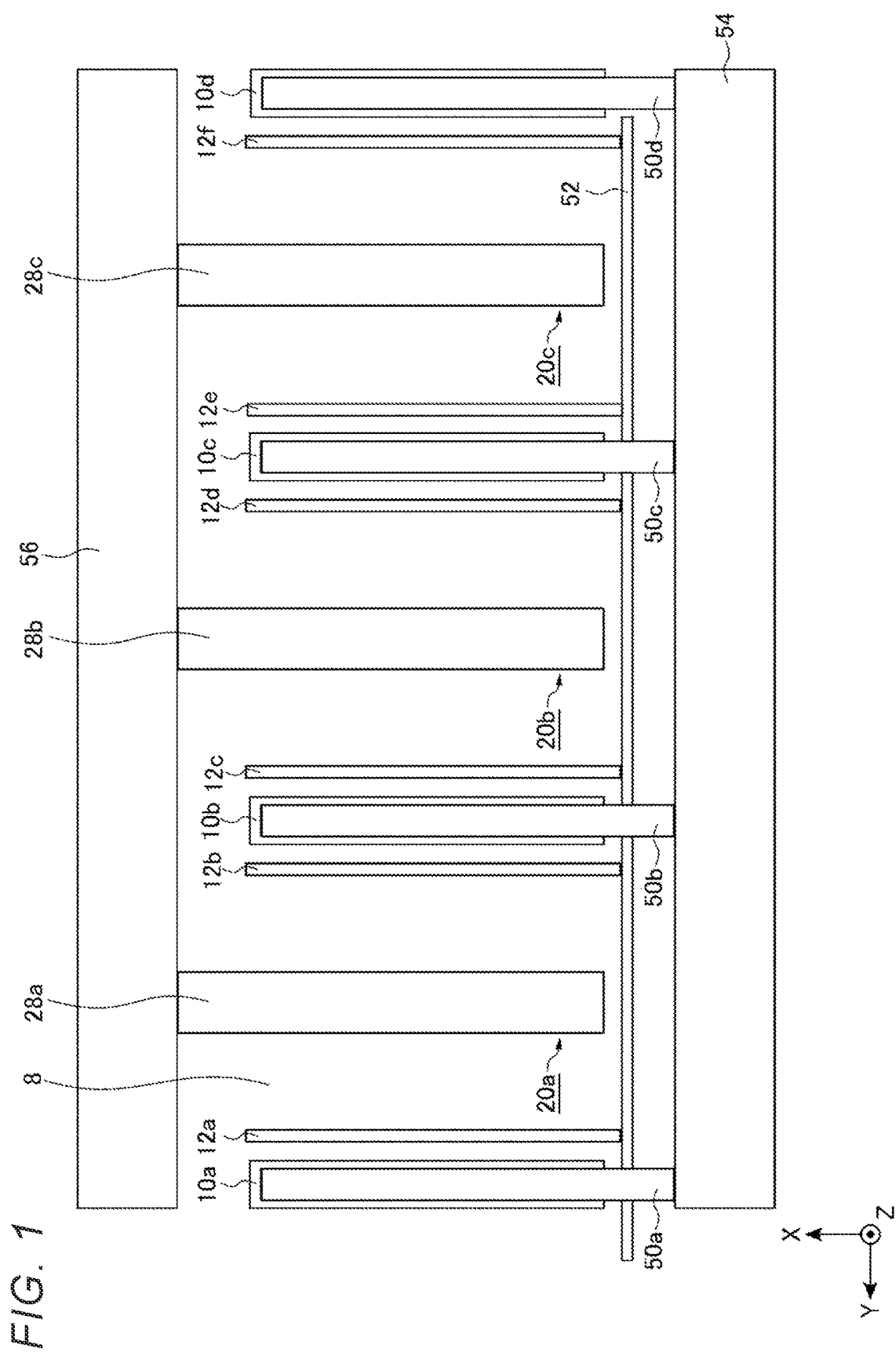
FIG. 1 is a schematic top view of a semiconductor device of a first embodiment.

Embodiments provide a semiconductor device having low output capacitance.

In general, according to one embodiment, a semiconductor device includes a first nitride semiconductor layer and a second nitride semiconductor layer above the first nitride semiconductor layer in a first direction. The second nitride semiconductor layer has a bandgap greater than that of the first nitride semiconductor layer. A first source electrode is on the second nitride semiconductor layer. A second source electrode is on the second nitride semiconductor layer spaced from the first source electrode in a second direction. A first gate electrode is on the second nitride semiconductor layer between the first source electrode and the second source electrode in the second direction. A second gate electrode is on the second nitride semiconductor layer between the second source electrode and the first gate electrode. The second gate electrode is spaced from the first gate electrode in the second direction. A drain electrode is on the second nitride semiconductor layer between the first gate electrode and the second gate electrode in the second direction. The drain electrode comprises a first wiring portion contacting the second nitride semiconductor layer; a second wiring portion contacting the second nitride semiconductor layer, the second wiring portion spaced from the first wiring portion in the second direction; an element isolation area extending in the first direction into the second nitride semiconductor layer from a region between the first wiring portion and the second wiring portion in the second direction; and a third wiring portion above the first wiring portion, the second wiring portion, and the element isolation area in the first direction and electrically connected to the first wiring portion and the second wiring portion. An insulating material is between the element isolation area and the third wiring portion in the first direction.

Hereinafter, certain example embodiments of the present disclosure will be described with reference to the drawings. It is noted that, in the following descriptions, corresponding or similar elements and the like are given the same reference symbols. Additionally, descriptions of already explained elements depicted again in subsequent drawings, embodiments and like may be omitted in some instances.

In this specification, in order to describe relative positional relationships of parts and elements, an upper page direction in a drawing may be referred to as on an "upper side," "upward," "above" or the like, whereas a lower page direction in a drawing may be referred to as on a "lower side," "lower," "below," or the like. In this specification, the concepts corresponding to such positional descriptive language do not reflect relationships to a direction of gravity.

First Embodiment

A semiconductor device of this embodiment includes a substrate, a first nitride semiconductor layer, a second nitride semiconductor layer, a first source electrode, a second source electrode, a first gate electrode, a second gate electrode, a drain electrode, and an insulation film. The first nitride semiconductor layer is provided over the substrate. The second nitride semiconductor layer is provided on the first nitride semiconductor layer and has a bandgap greater than that of the first nitride semiconductor layer. The first source electrode is provided on the second nitride semiconductor layer. The second source electrode is provided on the second nitride semiconductor layer. The first gate electrode is provided on the second nitride semiconductor layer between the first source electrode and the second source electrode. The second gate electrode is provided on the second nitride semiconductor layer between the second source electrode and the first gate electrode. The drain electrode is provided on the second nitride semiconductor layer between the first gate electrode and the second gate electrode and includes a first wiring, a second wiring, an element isolation area, and a fourth wiring. The second wiring is provided between the second gate electrode and the first wiring. The element isolation area is provided in the second nitride semiconductor layer under a region between the first wiring and the second wiring. The fourth wiring is provided over the first wiring, the second wiring, and the element isolation area and is electrically connected to the first wiring and the second wiring. The insulation film is provided between the element isolation area and the fourth wiring.

Figure 2A:
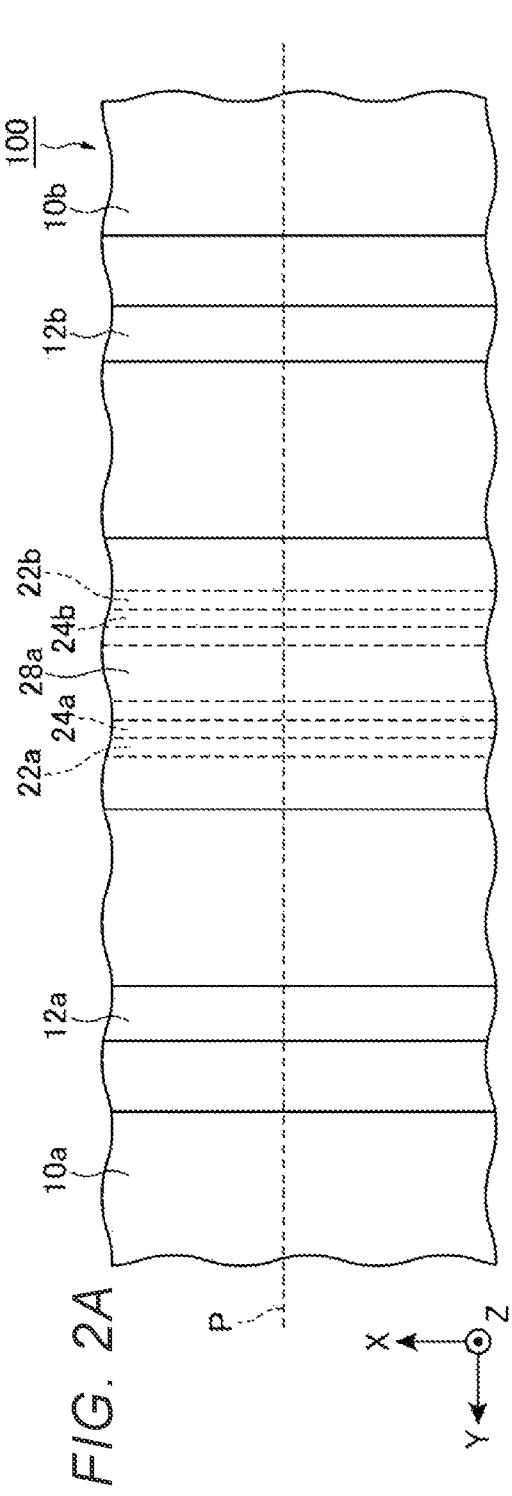
FIGS. 2A and 2B are schematic views of a semiconductor device of a first embodiment.
Figure 2B:
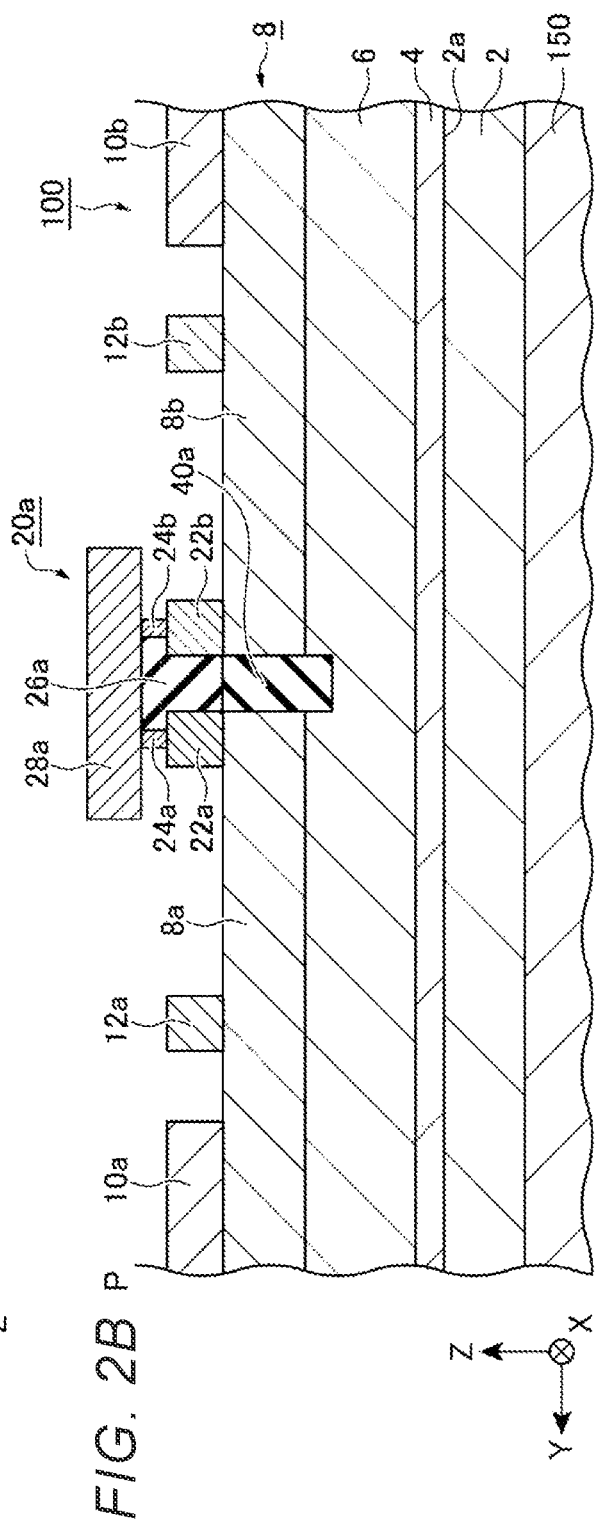

FIG. 1 is a schematic top view of a semiconductor device 100 of this first embodiment. FIGS. 2A and 2B are schematic views of the semiconductor device 100. FIG. 2A is a schematic top view of a part of the semiconductor device 100. FIG. 2B is a schematic cross-sectional view at a plane P (shown in FIG. 2A) of the semiconductor device 100. It is noted that a source wiring 50, which is shown in FIG. 1, is omitted in FIG. 2A.

The semiconductor device 100 is a high electron mobility transistor (HEMT) using a nitride semiconductor, such as gallium nitride (GaN), aluminum gallium nitride (AlGaN), or indium gallium nitride (InGaN). The electrode structure of the semiconductor device 100 is, for example, a multi-finger structure.

A substrate 2 uses, for example, a silicon (Si) substrate or a sapphire substrate. In particular, a silicon (Si) substrate is preferably used as the substrate 2. The substrate 2 has a substrate surface 2a.

A first nitride semiconductor layer 6 is, for example, undoped $Al_XGa_{1-X}N$ ($0 \leq X < 1$). More specifically, the first nitride semiconductor layer 6 is, for example, undoped GaN. The first nitride semiconductor layer 6 functions as a channel layer. The film thickness of the first nitride semiconductor layer 6 is, for example, 0.2 μm or greater and 3 μm or less.

A second nitride semiconductor layer 8 is provided on the first nitride semiconductor layer 6. The bandgap of the second nitride semiconductor layer 8 is greater than that of the first nitride semiconductor layer 6. The second nitride semiconductor layer 8 is, for example, undoped $Al_YGa_{1-Y}N$ ($0 < Y \leq 1$, $X < Y$). More specifically, the second nitride semiconductor layer 8 is, for example, undoped $Al_{0.2}Ga_{0.8}N$. The second nitride semiconductor layer 8 functions as a barrier layer. The film thickness of the second nitride semiconductor layer 8 is, for example, 15 nm or greater and 50 nm or less.

A third nitride semiconductor layer 4 is provided between the substrate 2 and the first nitride semiconductor layer 6. The third nitride semiconductor layer 4 functions as a buffer layer for reducing lattice mismatch between the substrate 2 and the first nitride semiconductor layer 6. The third nitride semiconductor layer 4 is formed of, for example, a multi-layer structure of aluminum gallium nitride ($Al_WGa_{1-W}N$ ($0 < W < 1$)).

In the example embodiments, an X direction, a Y direction orthogonal to the X direction, and a Z direction orthogonal to the X direction and the Y direction are defined for descriptive convenience. The Z direction corresponds to the stacking direction of the substrate 2, the third nitride semiconductor layer 4, the first nitride semiconductor layer 6, and the second nitride semiconductor layer 8. That is, the increasing (positive) Z direction is as established in FIG. 2 and the like. The substrate 2, the substrate surface 2a, the third nitride semiconductor layer 4, the first nitride semiconductor layer 6, and the second nitride semiconductor layer 8 are each provided planes parallel to X axis and the Y axis, that is, an each of these layers can be said to be in an XY plane. Likewise, the interface between the substrate 2 and the third nitride semiconductor layer 4, the interface between the third nitride semiconductor layer 4 and the first nitride semiconductor layer 6, and the interface between the first nitride semiconductor layer 6 and the second nitride semiconductor layer 8 are each provided in XY planes. The plane P indicated in FIG. 2A with a dashed line corresponds to a plane parallel to the YZ plane.

A heterojunction interface is formed between the first nitride semiconductor layer 6 and the second nitride semiconductor layer 8. During ON operation of the semiconductor device 100, two-dimensional electron gas (2DEG) is formed at the heterojunction interface and functions as a carrier.

Multiple source electrodes are provided on the second nitride semiconductor layer 8 in a separated manner. FIG. 1 depicts source electrodes 10a, 10b, 10c, and 10d as the multiple source electrodes. FIGS. 2A and 2B depict just the source electrodes 10a and 10b as the source electrodes. The source electrodes 10a, 10b, 10c, 10d extend in the X direction. The source electrodes 10a, 10b, 10c, 10d have, for example, a stacked structure of titanium (Ti) and aluminum (Al) or a stacked structure of nickel (Ni) and gold (Au).

Multiple gate electrodes are provided on the second nitride semiconductor layer 8 between source electrodes. FIG. 1 depicts gate electrodes 12a, 12b, 12c, 12d, 12e, and 12f as the multiple gate electrodes. FIGS. 2A and 2B depict the just gate electrodes 12a and 12b as the multiple gate electrodes. The gate electrodes 12a and 12b. The gate electrode 12a is provided between the source electrodes 10a and 10b. The gate electrode 12b is provided between the gate electrode 12a and the source electrode 10b. The gate electrodes 12a, 12b, 12c, 12d, 12e, and 12f have, for example, a stacked structure of titanium (Ti) and aluminum (Al) or a stacked structure of nickel (Ni) and gold (Au).

Multiple drain electrodes are provided on the second nitride semiconductor layer 8 between pairs of gate electrodes. FIG. 1 depicts drain electrodes 20a, 20b, and 20c as the multiple drain electrodes. FIGS. 2A and 2B depict just the drain electrode 20a. FIG. 1 depicts wirings 28a, 28b, and 28c as respective wirings (wiring portions) of the drain electrodes 20a, 20b, and 20c. The wirings 28a, 28b, and 28c are referred to below as fourth wirings 28a, 28b, and 28c.

Each of the drain electrodes 20a, 20b, and 20c has a first wiring 22a, a second wiring 22b, a fifth wiring 24a, a sixth wiring 24b, a fourth wiring 28, an insulation film 26, and an element isolation area 40a. The following description references the depiction of elements in FIG. 2A and FIG. 2B particularly, but applies similarly to the arrangements centered on the other drain electrodes.

The first wiring 22a extends in the X direction.

The second wiring 22b is provided between the gate electrode 12b and the first wiring 22a. The second wiring 22b extends in the X direction.

The element isolation area 40a is provided in the second nitride semiconductor layer 8 under a region between the first wiring 22a and the second wiring 22b. In FIG. 2B, the element isolation area 40a is provided between a second nitride semiconductor layer 8a portion of second nitride semiconductor layer 8 that is under the source electrode 10a and the gate electrode 12a, and a second nitride semiconductor layer 8b portion of the second nitride semiconductor layer 8 that is under the source electrode 10b and the gate electrode 12b. A lower part of the element isolation area 40a is embedded in an upper part of the first nitride semiconductor layer 6. The element isolation area 40a is formed by, for example, injecting argon (Ar) ions into the first nitride semiconductor layer 6 and the second nitride semiconductor layer 8. Alternatively, the element isolation area 40a may be formed by embedding an insulating material having a low relative permittivity, such as a polyimide film or a benzocyclobutene (BCB) film, in the first nitride semiconductor layer 6 and the second nitride semiconductor layer 8.

The fifth wiring 24a is provided on the first wiring 22a and is electrically connected to the first wiring 22a.

The sixth wiring 24b is provided on the second wiring 22b and is electrically connected to the second wiring 22b.

The fourth wiring 28a is provided on the fifth wiring 24a and the sixth wiring 24b and is electrically connected to the fifth wiring 24a and the sixth wiring 24b. In other words, the fifth wiring 24a is provided between the first wiring 22a and the fourth wiring 28a. The sixth wiring 24b is provided between the second wiring 22b and the fourth wiring 28a.

The insulation film 26a is provided in a region enclosed by the element isolation area 40a, the first wiring 22a, the fifth wiring 24a, the fourth wiring 28a, the sixth wiring 24b, and the second wiring 22b in the cross section of the semiconductor device 100 as shown in FIG. 2B. For example, the insulation film 26a is provided between an upper end of the element isolation area 40a and a lower surface of the fourth wiring 28a.

Multiple source wirings 50a, 50b, 50c, 50d are provided on the respective source electrodes 10a, 10b, 10c, 10d and are electrically connected to the respective source electrodes 10a, 10b, 10c, 10d. In FIG. 1, source wirings 50a, 50b, 50c, and 50d are provided on the source electrodes 10a, 10b, 10c, and 10d. The source wirings 50a, 50b, 50c, and 50d are each coupled to a wiring 54. The fourth wirings 28a, 28b, and 28c are electrically connected to a wiring 56. The gate electrodes 12a, 12b, 12c, 12d, 12e, and 12f are electrically connected to a wiring 52. The wirings 52, 54, and 56 are, for example, electrically connected to an external electric circuit, which is not separately depicted.

For example, an interlayer insulation film, which is not specifically depicted in the drawings, is provided covering the second nitride semiconductor layer 8, the source electrodes 10a, 10b, 10c, 10d, the gate electrodes 12a, 12b, 12c, 12d, 12e, 12f, the drain electrodes 20a, 20b, 20c, 20d, and the source wirings 50a, 50b, 50c, 50d. The wirings 52, 54, and 56 can be embedded in the interlayer insulation film.

The substrate 2 of the semiconductor device 100 is mounted on, for example, a metal package 150 (FIG. 2B).

The first wiring 22a, the second wiring 22b, the fifth wiring 24a, the sixth wiring 24b, the fourth wiring 28a, the source wiring 50, and the wirings 52, 54, and 56 have, for example, a stacked structure comprising titanium (Ti) and aluminum (Al) or a stacked structure comprising nickel (Ni) and gold (Au). The insulation film 26a comprises, for example, an insulating material having a low relative permittivity, such as a polyimide film or a benzocyclobutene (BCB) film.

Figure 3:
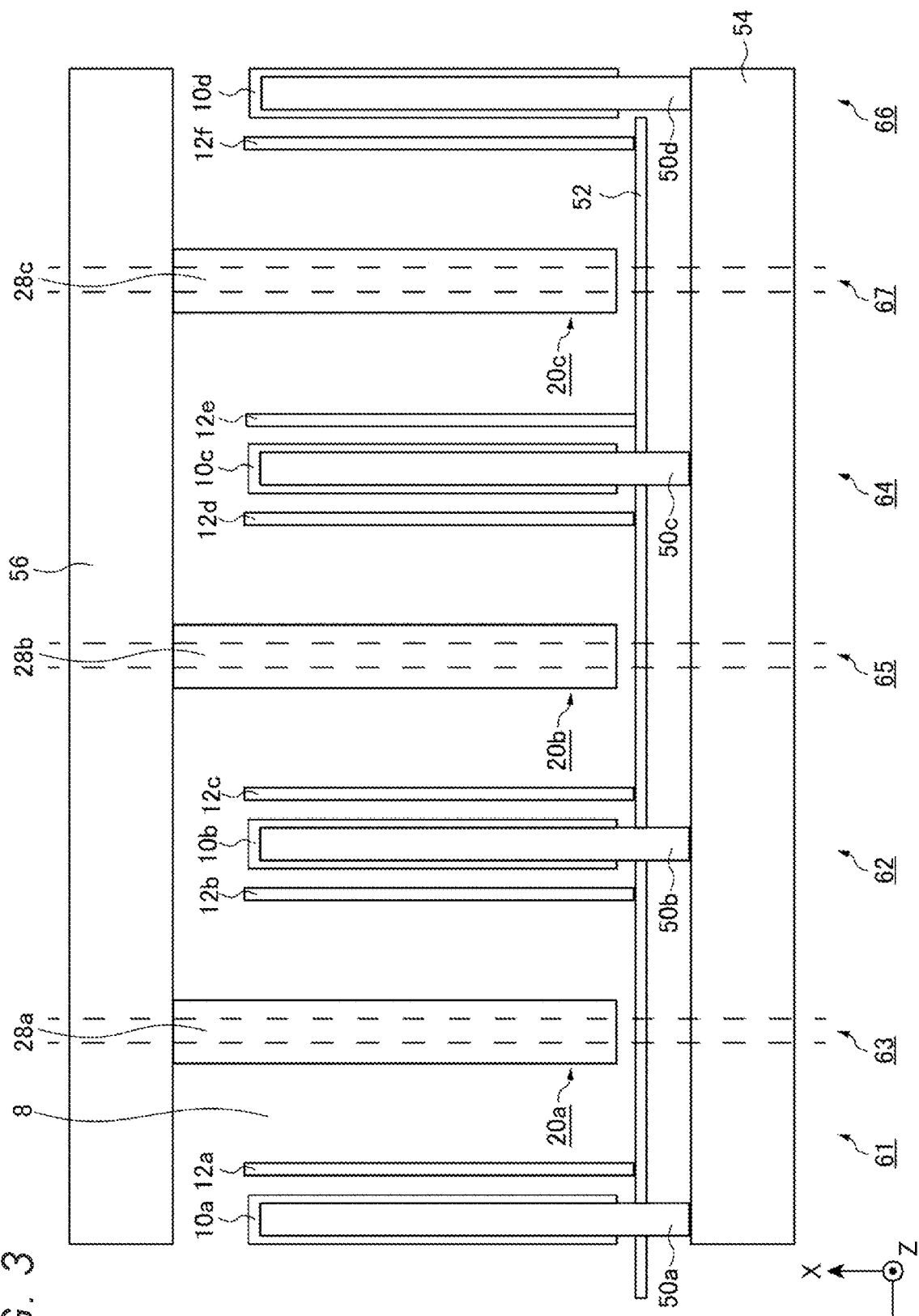
FIG. 3 is another schematic top view of a semiconductor device of a first embodiment.

FIG. 3 is a schematic top view of a semiconductor device 100. FIG. 3 is different from FIG. 1 in that FIG. 3 specifically labels a first region 61, a second region 62, a third region 63, a fourth region 64, a fifth region 65, a sixth region 66, and a seventh region 67. The third region 63 is provided between the first region 61 and the second region 62. The second region 62 is provided between the third region 63 and the fifth region 65. The fifth region 65 is provided between the second region 62 and the fourth region 64. The fourth region 64 is provided between the fifth region 65 and the seventh region 67. The seventh region 67 is provided between the fourth region 64 and the sixth region 66.

FIGS. 4A and 4B are additional schematic views of the semiconductor device 100. FIGS. 4A and 4B are different from FIGS. 2A and 2B in that FIGS. 4A and 4B label the first region 61, the second region 62, and the third region 63. The insulation film 26a is in the third region 63 though portions may extend outside of the third region 63.

In another aspect of this embodiment, a semiconductor device includes a substrate, a first nitride semiconductor layer, a second nitride semiconductor layer, a first gate electrode, a first source electrode, a second gate electrode, a second source electrode, a drain electrode, and an insulation film. The first nitride semiconductor layer is provided over the substrate. The second nitride semiconductor layer has a first region, a second region, and a third region between the first region and the second region. The second nitride semiconductor layer is provided on the first nitride semiconductor layer and has a bandgap greater than that of the first nitride semiconductor layer. The first gate electrode is provided in the first region and extends in a first direction parallel to a substrate surface of the substrate. The first source electrode is provided in the first region and extends in the first direction. The second gate electrode is provided in the second region and extends in the first direction. The second source electrode is provided in the second region and extends in the first direction. The drain electrode is coupled to a first wiring and a second wiring. The first wiring is provided in the first region. The second wiring is provided in the second region. The insulation film is provided in the third region.

As shown in FIGS. 4A and 4B, the first wiring 22a in the first region 61 is provided at a position that is closer to the insulation film 26a of the third region 63 than to the source electrode 10a and the gate electrode 12a. The second wiring 22b in the second region 62 is provided at a position that is closer to the insulation film 26a in the third region 63 than to the source electrode 10b and the gate electrode 12b. That is, the first wiring 22a and the second wiring 22b are provided at positions closest to the insulation film 26a. The first wiring 22a is provided at an end of the first region 61 near an outer edge of the first region 61 facing the third region 63, and the second wiring 22b is provided at an end of the second region 62 near an outer edge of the second region 62 facing the third region 63. The first wiring 22a, the second wiring 22b, the fifth wiring 24a, and the sixth wiring 24b are in contact with the insulation film 26a. In this particular example embodiment, the bottom of the insulation film 26a extends deeper into the semiconductor device 100 than does the second nitride semiconductor layer 8. That is, the insulating film 26a extends through full layer thickness of the second nitride semiconductor layer 8 and the bottom of the insulation film 26a is provided on the first nitride semiconductor layer 6. More particularly, in the present example, the insulating film 26a extends through full layer thickness of the second nitride semiconductor layer 8 and into the first nitride semiconductor layer 6.

It should be noted that the first region 61, the second region 62, and the third region 63 are particularly described in this context, but the same description applies to the fourth region 64, the fifth region 65, the sixth region 66, and the seventh region 67 and the corresponding wiring, semiconductor, and insulating portions depicted for those regions.

FIGS. 5A to 5D are schematic cross-sectional views of semiconductor devices 100 of other implementations of the first embodiment.

Figure 5A:
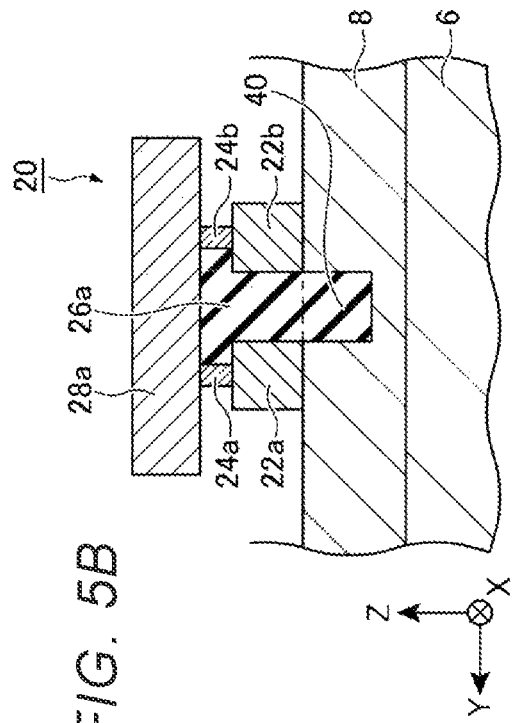
FIGS. 5A to 5D are schematic cross-sectional views of semiconductor devices of other example implementations of a first embodiment.
Figure 5B:
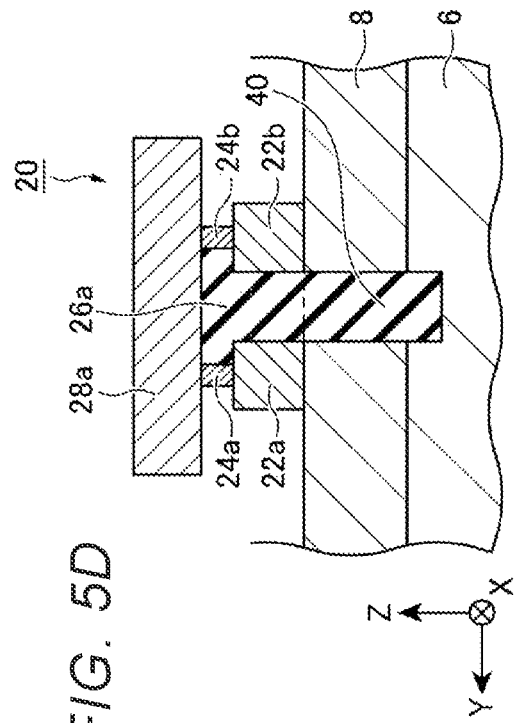
Figure 5C:
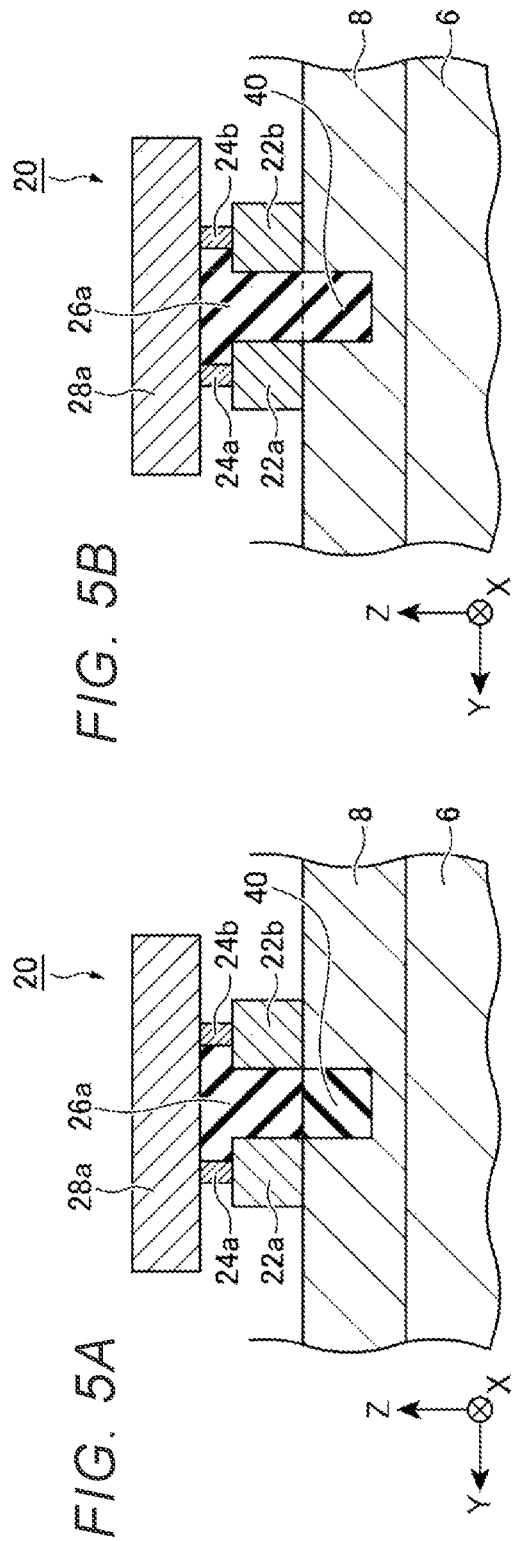
Figure 5D:
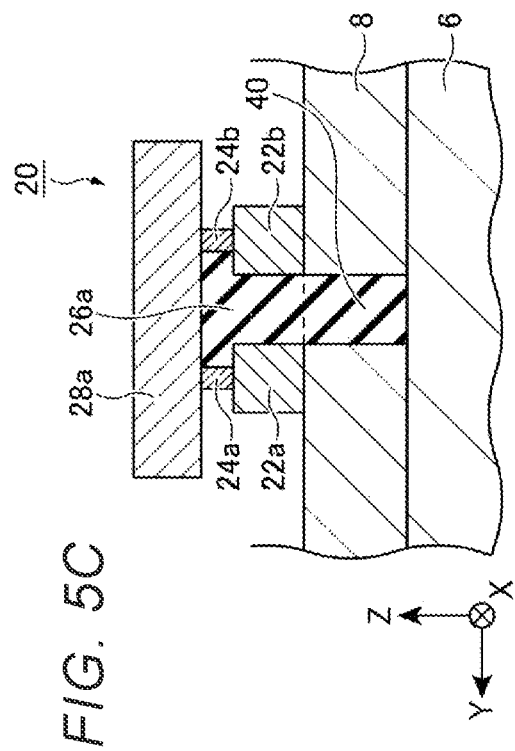

As shown in FIG. 5A, the element isolation area 40 may be provided in the second nitride semiconductor layer 8 without reaching the first nitride semiconductor layer 6. As shown in FIGS. 5B, 5C, and 5D, the element isolation area 40 may be formed integrally with the insulation film 26a that includes an insulating material, such as a polyimide film or a benzocyclobutene (BCB) film. That is, in some examples, the element isolation region 40 and the insulation film 26a may be compositionally identical, or substantially so, and may in some instances be formed in the same fabrication process.

As shown in FIG. 5B, the element isolation area 40 may be provided in the second nitride semiconductor layer 8 without reaching the first nitride semiconductor layer 6, such that a part of the second nitride semiconductor layer 8 is provided between the element isolation area 40 and the first nitride semiconductor layer 6.

In another variation, the element isolation area 40 may be in contact with an upper surface of the first nitride semiconductor layer 6, as shown in FIG. 5C. That is, rather than penetrating into the first nitride semiconductor layer 6, the element isolation area 40 may be on the uppermost surface of the first nitride semiconductor layer 6.

Additionally, the element isolation area 40 may be provided to penetrate a portion of the first nitride semiconductor layer 6 in such a manner that a lower part of the element isolation area 40 is embedded in the first nitride semiconductor layer 6, as shown in FIG. 5D.

Next, functions and effects of the semiconductor device 100 of this first embodiment will be described.

Figure 6:
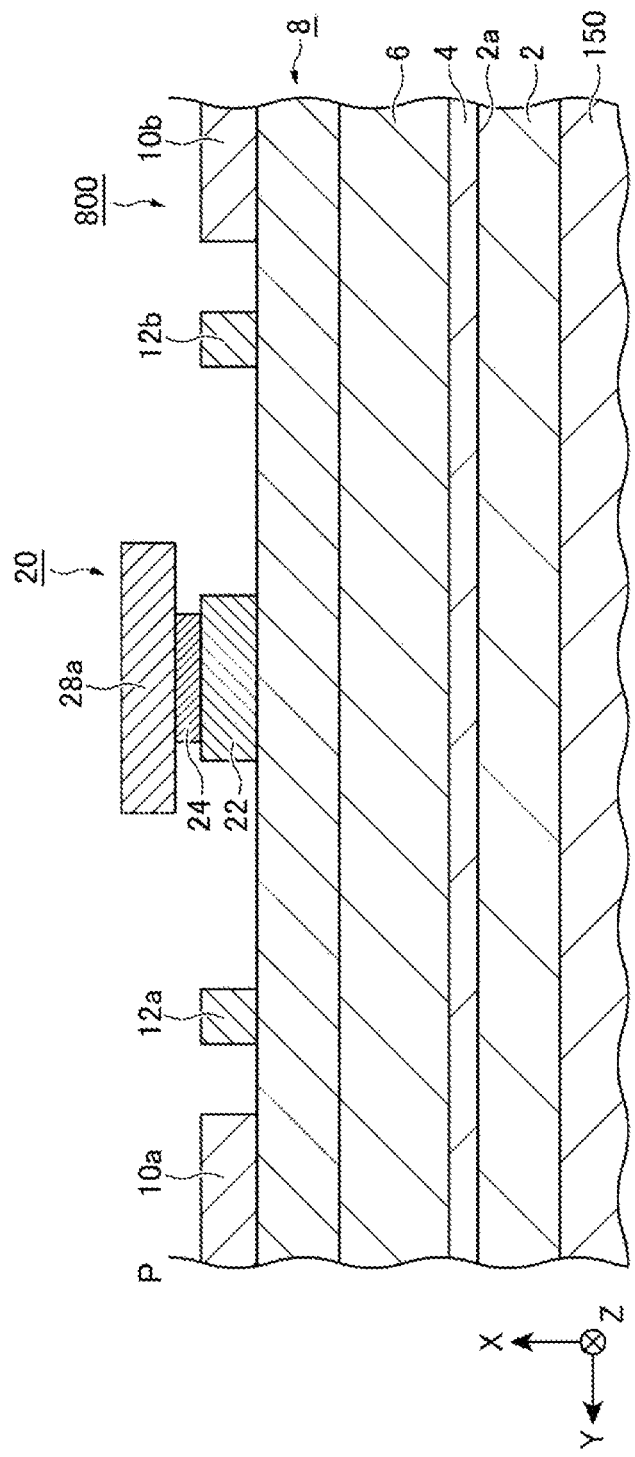
FIG. 6 is a schematic cross-sectional view of a semiconductor device of a comparative example.

FIG. 6 is a schematic cross-sectional view of a semiconductor device 800 of a comparative example. In semiconductor device 800, the element isolation area 40 and the insulation film 26a are not provided. The wiring 22 is provided as a unitary, integrated body rather than as separated portions as in the semiconductor device 100 with the first wiring 22a and the second wiring 22b. Likewise, the wiring 24 is provided as a unitary, integrated body rather than as separated portions as in the semiconductor 100 with the fifth wiring 24a and the sixth wiring 24b.

The semiconductor devices of these examples are intended for applications such as high frequency power semiconductor devices. However, semiconductor devices generally have a large output capacitance $C_{oss}$. The output capacitance $C_{oss}$ is a sum of a drain-source capacitance $C_{ds}$ and a gate-drain capacitance $C_{gd}$. The drain-source capacitance $C_{ds}$ is greatly affected by a capacitance component between the drain electrode 20 and the substrate 2 or a capacitance component between the drain electrode 20 and the package 150 provided under the substrate 2. In high frequency operation, switching loss due to charging and discharging is large with respect to the output capacitance $C_{oss}$, and therefore, it is difficult to provide a semiconductor device that fully exhibits both high breakdown field strength and high electron mobility.

When a two-dimensional electron gas (2DEG) is formed at the heterojunction interface under the drain electrode 20, the drain electrode 20 and the two-dimensional electron gas are electrically connected to each other. For this reason, the capacitance component between the two-dimensional electron gas and the substrate 2, or the capacitance component between the two-dimensional electron gas and the package 150 provided under the substrate 2, affects the output capacitance $C_{oss}$, whereby switching loss tends to be large.

It is possible to reduce the output capacitance $C_{oss}$ by decreasing the area of the drain electrode 20 in a plane parallel to the substrate surface 2a. However, this increases on-state resistance of the semiconductor device.

In the semiconductor device 100, the separated first wiring 22a and the second wiring 22b are provided instead of the unitary wiring 22 (FIG. 6) of the comparative semiconductor device 800. This separation of first wiring 22a and second wiring 22b reduces the capacitance component between the substrate 2 and the drain electrode 20 and/or the capacitance component between the package 150 and the drain electrode 20.

Moreover, providing the element isolation areas 40 as in the semiconductor 100 decreases the concentration of two-dimensional electron gas that is formed at the heterojunction interface under the region between the first wiring 22a and the second wiring 22b. This reduces the capacitance component between the substrate 2 and the two-dimensional electron gas and/or the capacitance component between the package 150 and the two-dimensional electron gas. The concentration of the two-dimensional electron gas that is formed at the heterojunction interface under the region between the first wiring 22a and the second wiring 22b is most preferably zero.

The above-described structure of semiconductor device 100 enables the provision of a low output capacitance. The fourth wiring 28a works to prevent an increase in on-state resistance.

In addition, the fifth wiring 24a and the sixth wiring 24b that are provided in semiconductor device 100 enable further increasing the distance between the fourth wiring 28a and the substrate 2 and the package 150. Thus, the capacitance component between the fourth wiring 28a and the substrate 2 or the package 150 can be reduced.

The semiconductor device 100 is well suited for use in a case in which the substrate 2 is a silicon (Si) substrate. This is because the silicon (Si) substrate has a high electric conductivity compared with a sapphire substrate or the like and thereby tends to cause a large output capacitance $C_{oss}$ between the substrate 2 and the drain electrode 20 and thus to cause high switching loss.

The insulation film 26a uses a low relative permittivity material, such as a polyimide film, a benzocyclobutene (BCB) film, or a carbon-containing silicon oxide film (SiOC film), whereby the capacitance component between the fourth wiring 28a and the substrate 2 is further reduced.

The semiconductor device 100 thus can have low output capacitance.

Second Embodiment

A semiconductor device of this second embodiment includes a substrate, a first nitride semiconductor layer, a second nitride semiconductor layer, a first source electrode, a second source electrode, a first gate electrode, a second gate electrode, a drain electrode, and an insulation film. The first nitride semiconductor layer is provided over the substrate. The second nitride semiconductor layer is provided on the first nitride semiconductor layer and has a bandgap greater than that of the first nitride semiconductor layer. The first source electrode is provided on the second nitride semiconductor layer and extends in a first direction parallel to a substrate surface of the substrate. The second source electrode is provided on the second nitride semiconductor layer and extends in the first direction. The first gate electrode is provided on the second nitride semiconductor layer between the first source electrode and the second source electrode and extends in the first direction. The second gate electrode is provided on the second nitride semiconductor layer between the second source electrode and the first gate electrode and extends in the first direction. The drain electrode is provided on the second nitride semiconductor layer between the first gate electrode and the second gate electrode and includes a first wiring, a second wiring, multiple element isolation areas, multiple third wirings, and a fourth wiring. The first wiring extends in the first direction. The second wiring is provided between the second gate electrode and the first wiring and extends in the first direction. The multiple element isolation areas are provided in the second nitride semiconductor layer under a region between the first wiring and the second wiring, in a manner mutually separated in the first direction. The multiple third wirings are provided on the second nitride semiconductor layer between the multiple element isolation areas and electrically connect the first wiring and the second wiring to each other. The fourth wiring is provided over the first wiring, the second wiring, the multiple element isolation areas, and the multiple third wirings. The insulation film is provided between the multiple element isolation areas and the fourth wiring.

Figure 7:
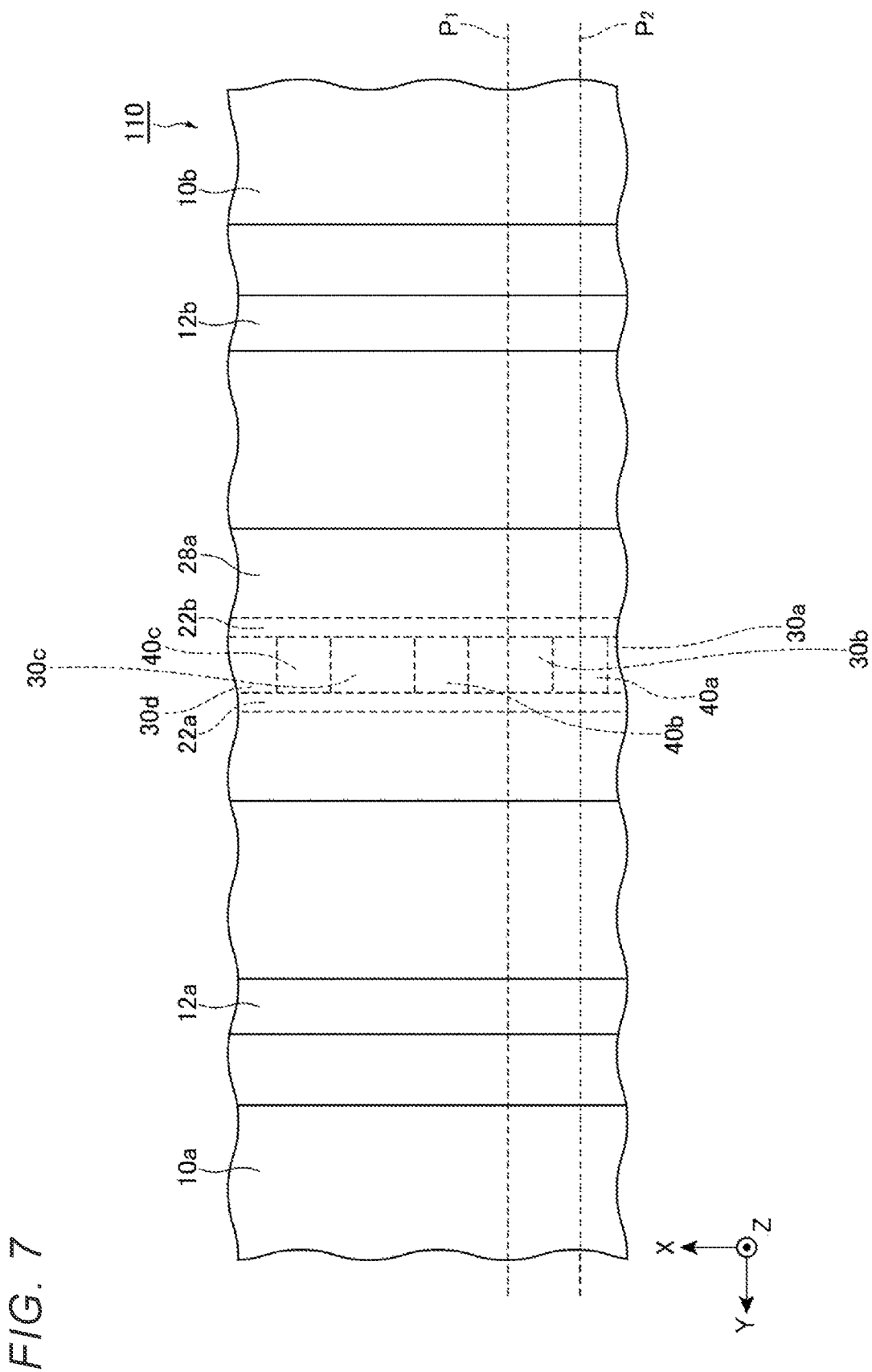
FIG. 7 is a schematic top view of a semiconductor device of a second embodiment.

FIG. 7 is a schematic top view of a semiconductor device 110 of the second embodiment. FIG. 8A is a schematic cross-sectional view at a plane $P_1$ that is parallel to the YZ plane of the semiconductor device 110 of this example. FIG. 8B is a schematic cross-sectional view at a plane $P_2$ that is parallel to the YZ plane of the semiconductor device 110 of this example.

The semiconductor device 110 is different from the semiconductor device 100 in that element isolation areas are provided in the second nitride semiconductor layer 8 between the first wiring 22a and the second wiring 22b in a separated from each in the X direction, as shown in FIGS. 7 and 8A. FIG. 7 depicts element isolation areas 40a, 40b, and 40c as examples of the separated element isolation areas.

Moreover, the semiconductor device 110 is different from the semiconductor device 100 in that third wiring portions 30a, 30b, 30c, 30d are provided on the second nitride semiconductor layer 8 in regions between or adjacent to the separated element isolation areas 40a, 40b, 40c for electrically connecting the first wiring 22a and the second wiring 22b to each other, as shown in FIG. 8B. FIG. 7 shows third wiring portions 30a, 30b, 30c, and 30d as the separated portions corresponding to the third wiring 30.

Furthermore, the semiconductor device 110 is different from the semiconductor device 100 in that the separated third wiring portions 30a, 30b, 30c, 30d and the fourth wiring 28a are electrically connected to each other without a fifth wiring 24a and a sixth wiring 24b being required in the connection.

It should be noted that the insulation film 26a is omitted the depiction of in FIGS. 8A and 8B for purposes of clarity.

A height $h_2$ of the multiple third wiring portions 30a, 30b, 30c, 30d is preferably greater than a height $h_1$ of the first wiring 22a and the second wiring 22b. This is in order to reduce the output capacitance $C_{oss}$ by increasing the distance between the fourth wiring 28a and the substrate 2 or the package 150. In other examples, the height of the first wiring 22a and the height of the second wiring 22b may be different from each other.

The semiconductor device of this embodiment also provides low output capacitance.

Third Embodiment

A semiconductor device of this embodiment includes a substrate, a first nitride semiconductor layer, a second nitride semiconductor layer, a first source electrode, a second source electrode, a first gate electrode, a second gate electrode, a drain electrode, and an insulation film. The first nitride semiconductor layer is provided over the substrate. The second nitride semiconductor layer is provided on the first nitride semiconductor layer and has a bandgap greater than that of the first nitride semiconductor layer. The first source electrode is provided on the second nitride semiconductor layer and extends in a first direction parallel to a substrate surface of the substrate with an increasing width in a second direction that crosses the first direction. The second source electrode is provided on the second nitride semiconductor layer and extends in the first direction with an increasing width in the second direction. The first gate electrode is provided on the second nitride semiconductor layer between the first source electrode and the second source electrode in a manner separated from the first source electrode and the second source electrode. The second gate electrode is provided on the second nitride semiconductor layer between the second source electrode and the first gate electrode in a manner separated from the second source electrode and the first gate electrode. The drain electrode is provided on the second nitride semiconductor layer between the first gate electrode and the second gate electrode and includes a fourth wiring, a first wiring, a second wiring, and an element isolation area. The fourth wiring extends in the first direction with a decreasing width in the second direction. The first wiring is provided between the second nitride semiconductor layer and the fourth wiring and extends substantially parallel to a side surface facing the first gate electrode of the first source electrode. The second wiring is provided between the second nitride semiconductor layer and the fourth wiring that are between the first wiring and the second gate electrode, and the second wiring extends substantially parallel to a side surface facing the second gate electrode of the second source electrode. The element isolation area is provided in the second nitride semiconductor layer under a region between the first wiring and the second wiring. The insulation film is provided between the element isolation area and the fourth wiring.

Figure 9:
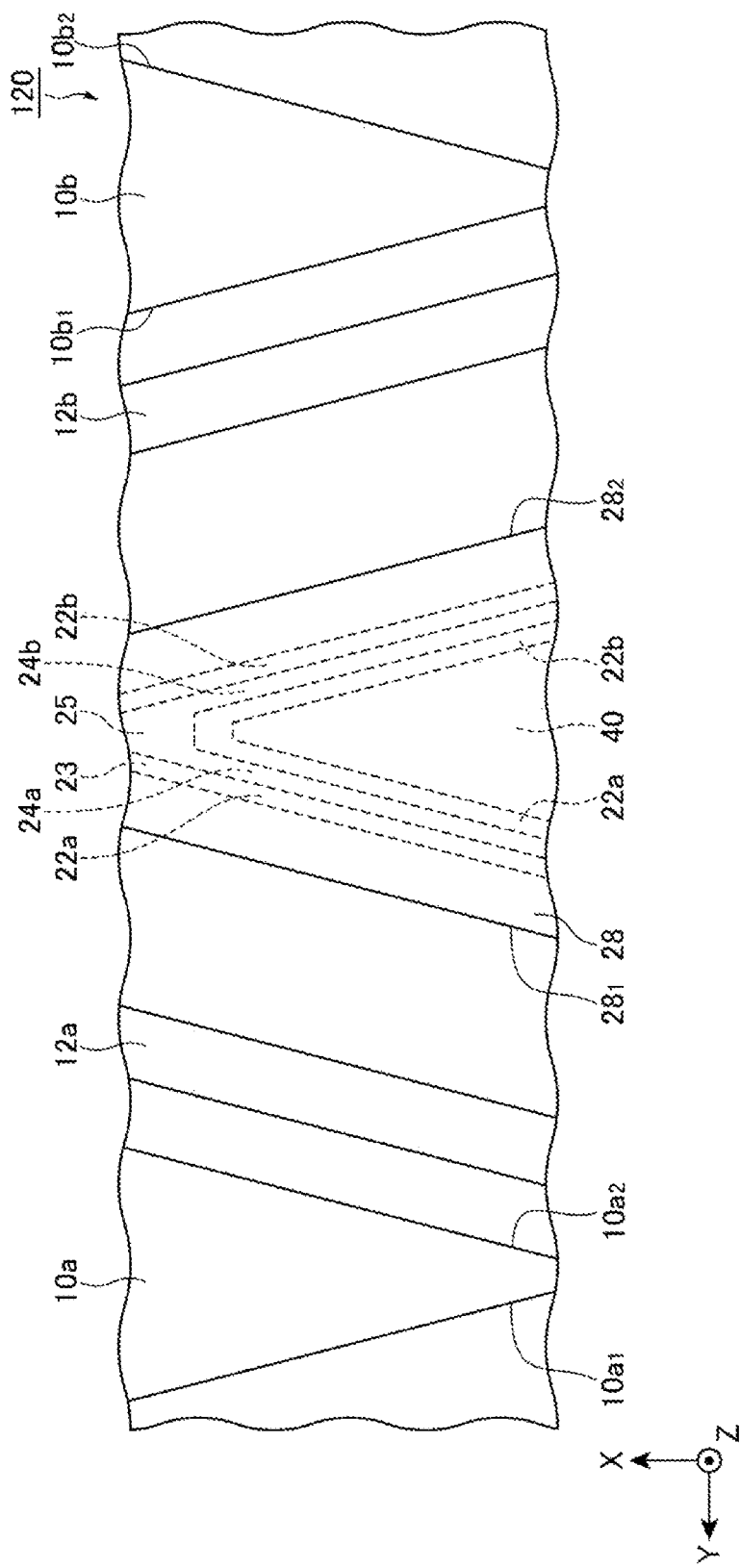
FIG. 9 is a schematic top view of a semiconductor device of a third embodiment.

FIG. 9 is a schematic top view of a semiconductor device 120 of this third embodiment.

The source electrodes 10a and 10b extend in the positive X direction with increasing widths in the Y direction. This arrangement may be adopted because the amount of carriers flowing in the source electrodes 10a and 10b are presumed to be reduced as the source electrodes 10a and 10b with distance from the wiring 54 (FIG. 1), and therefore, the widths of the source electrodes 10 at parts farther from the wiring 54 can be narrowed.

The fourth wiring 28 extends in the positive X direction with a decreasing width in the Y direction. This arrangement may be adopted because the amount of carriers flowing in the drain electrode 20 is presumed to be reduced as the drain electrode 20 with distance from the wiring 56 (FIG. 1), and therefore, the width of the fourth wiring 28 at a part farther from the wiring 56 can be narrowed.

The source electrode 10a has a side surface $10a_1$ and a side surface $10a_2$. The side surface $10a_2$ faces the gate electrode 12a. The source electrode 10b has a side surface $10b_2$ and a side surface $10b_1$. The side surface $10b_1$ faces the gate electrode 12b. The fourth wiring 28 has side surfaces $28_1$ and $28_2$. The side surface $28_1$ is at a distance to the gate electrode 12a that is shorter than a distance to the gate electrode 12b. The side surface $28_2$ is at a distance to the gate electrode 12b that is shorter than a distance to the gate electrode 12a.

The side surfaces $10a_2$ and $28_1$ are parallel to each other in this example. The gate electrode 12a extends substantially parallel to the side surfaces $10a_2$ and $28_1$. The gate electrode 12a need not necessarily extend completely parallel to the side surfaces $10a_2$ and $28_1$ in other examples.

The side surfaces $10b_1$ and $28_2$ are parallel to each other in this example. The gate electrode 12b extends substantially parallel to the side surfaces $10b_1$ and $28_2$. The gate electrode 12b need not necessarily extend completely parallel to the side surfaces $10b_1$ and $28_2$ in other examples.

The first wiring 22a is provided between the second nitride semiconductor layer 8 and the fourth wiring 28. In the present example, the first wiring 22a extends substantially parallel to the side surfaces $10a_2$ and $28_1$. The first wiring 22a need not necessarily extend completely parallel to the side surfaces $10a_2$ and $28_1$ in other examples.

The second wiring 22b is provided between the second nitride semiconductor layer 8 and the fourth wiring, which are between the first wiring 22a and the gate electrode 12b. The second wiring 22b extends substantially parallel to the side surfaces $10b_1$ and $28_2$ in this example. The second wiring 22b need not necessarily extend completely parallel to the side surfaces $10b_1$ and $28_2$ in other examples.

The first wiring 22a and the second wiring 22b are coupled (connected) to one another at, for example, a coupling part 23.

The fifth wiring 24a is provided between the first wiring 22a and the fourth wiring 28 and electrically connects the first wiring 22a and the fourth wiring 28 to each other. The fifth wiring 24a extends, for example, substantially parallel to the side surfaces $10a_2$ and $28_1$.

The sixth wiring 24b is provided between the second wiring 22b and the fourth wiring 28 and electrically connects the second wiring 22b and the fourth wiring 28 to each other. The sixth wiring 24b extends, for example, substantially parallel to the side surfaces $10b_1$ and $28_2$.

The fifth wiring 24a and the sixth wiring 24b are coupled to one another at, for example, a coupling part 25.

The element isolation area 40 is provided in the second nitride semiconductor layer 8 in a region between the first wiring 22a and the second wiring 22b.

In the semiconductor device 120 of this third embodiment, the source electrodes 10a and 10b extend in the X direction with increasing widths in the Y direction, and the fourth wiring 28 extends in the X direction with decreasing width in the Y direction. This semiconductor device 120 has low output capacitance.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first nitride semiconductor layer;
   a second nitride semiconductor layer on the first nitride semiconductor layer and having a first region, a second region, a third region between the first region and the second region in a first direction that is parallel to a surface of the first nitride semiconductor layer, the second nitride semiconductor layer having a bandgap greater than that of the first nitride semiconductor layer;
   a first gate electrode on the first region and extending in a second direction that is parallel to the surface of the first nitride semiconductor layer;
   a first source electrode on the first region and extending in the second direction;
   a second gate electrode on the second region and extending in the second direction;
   a second source electrode on the second region and extending in the second direction;
   a drain electrode electrically connected to a first wiring and a second wiring, the first wiring directly contacting the second nitride semiconductor layer in the first region, the second wiring directly contacting the second nitride semiconductor layer in the second region; and
   an insulation material on the third region, wherein
   the first wiring and the second wiring are separated from each other in the first direction, and
   a portion of the drain electrode is above the first wiring, the second wiring, and the insulation material in a third direction orthogonal to the surface of the first nitride semiconductor layer such that the first and second wirings are between the portion of the drain electrode and the second nitride semiconductor layer in the third direction.

2. The semiconductor device according to claim 1, wherein the insulation material extends into the second nitride semiconductor layer.

3. The semiconductor device according to claim 1, wherein the insulation material extends into the first nitride semiconductor layer.

4. The semiconductor device according to claim 1, wherein the insulation material extends through the second nitride semiconductor layer to an upper surface of the first nitride semiconductor layer.

5. The semiconductor device according to claim 1, further comprising:
   a third wiring above the first wiring in the third direction, the third wiring being electrically connected to the first and second wirings.

6. The semiconductor device according to claim 1, wherein a width of the insulation material in the first direction narrows with distance along the second direction.

7. The semiconductor device according to claim 1, wherein a width of the first source electrode in the first direction narrows with distance along the second direction.

8. The semiconductor device according to claim 7, wherein a width of the second source electrode in the first direction narrows with distance along the second direction.

9. The semiconductor device according to claim 1, wherein a heterojunction interface is formed between the first and second nitride semiconductor layers.

10. The semiconductor device according to claim 1, wherein the portion of the drain electrode is spaced from the insulation material in a third direction.

11. The semiconductor device according to claim 1, wherein the insulation material is between the first and second wirings in the first direction.

12. The semiconductor device according to claim 11, wherein the portion of the drain electrode directly contacts an upper surface of the insulation material.

13. The semiconductor device according to claim 12, wherein the upper surface of the insulation material is above an upper surface of the second nitride semiconductor layer.

14. The semiconductor device according to claim 13, further comprising:
   a third wiring above the first wiring in the third direction and electrically connecting the first wiring to the portion of the drain electrode; and
   a fourth wiring above the second wiring in the third direction and electrically connecting the second wiring to the portion of the drain electrode.

15. The semiconductor device according to claim 14, wherein the insulation material is between the third and fourth wirings in the first direction.

16. The semiconductor device according to claim 14, wherein
the maximum width of the third wiring in the first direction is less than the maximum width of the first wiring in the first direction, and
the maximum width of the fourth wiring in the first direction is less than the maximum width of the second wiring in the first direction.

17. The semiconductor device according to claim 16, wherein the portion of the drain electrode extends in the first direction beyond an outermost sidewall of the first wiring and an outermost sidewall of the second wiring.

18. A semiconductor device, comprising:
a first nitride semiconductor layer;
a second nitride semiconductor layer on the first nitride semiconductor layer and having a first region, a second region, a third region between the first region and the second region in a first direction that is parallel to a surface of the first nitride semiconductor layer, the second nitride semiconductor layer having a bandgap greater than that of the first nitride semiconductor layer;
a first gate electrode on the first region and extending in a second direction that is parallel to the surface of the first nitride semiconductor layer;
a first source electrode on the first region and extending in the second direction;
a second gate electrode on the second region and extending in the second direction;
a second source electrode on the second region and extending in the second direction;
a first wiring directly contacting the second nitride semiconductor layer in the first region at a first position between the first and second gate electrodes in the first direction;
a second wiring directly contacting the second nitride semiconductor layer in the second region at a second position between the first and second gate electrodes in the first direction;
an insulation material on the third region; and
a third wiring above the first wiring, the second wiring, and the insulation material in a third direction orthogonal to the surface of the first nitride semiconductor layer, wherein
the third wiring is electrically connected to the first and second wiring,
the first wiring and the second wiring are separated from each other in the first direction, and
the third wiring is separated from the first and second wirings in the third direction.

19. The semiconductor device according to claim 18, further comprising:
a fourth wiring between the first wiring and the third wiring in the third direction;
a fifth wiring between the second wiring and the fourth wiring in the third direction, wherein
the fourth and fifth wirings are separate from each other in the first direction,
the fourth wiring electrically connects the first wiring to the third wiring, and
the fifth wiring electrically connects the second wiring to the third wiring.

20. The semiconductor device according to claim 19, wherein
the maximum width of the fourth wiring in the first direction is less than the maximum width of the first wiring in the first direction,
the maximum width of the fifth wiring in the first direction is less than the maximum width of the second wiring in the first direction,
the insulation material is between the fourth and fifth wiring in the first direction,
the insulation material directly contacts the third wiring, and
the third wiring is electrically connected to a drain electrode.

* * * * *